(12) United States Patent
Fang et al.

(10) Patent No.: US 7,158,400 B2
(45) Date of Patent: Jan. 2, 2007

(54) METHOD OF OPERATING DYNAMIC RANDOM ACCESS MEMORY

(75) Inventors: Hong-Gee Fang, Luodong Township Yilan County (TW); Wen-Chieh Lee, Chupei (TW); Ching-Tang Wu, Hsinchu (TW)

(73) Assignee: Memocom Corp., Hsin-Chu (TW)

( * ) Notice: Subject to any disclaimer, the term of this patent is extended or adjusted under 35 U.S.C. 154(b) by 0 days.

(21) Appl. No.: 10/711,938

(22) Filed: Oct. 14, 2004

(65) Prior Publication Data

US 2006/0023487 A1 Feb. 2, 2006

(30) Foreign Application Priority Data

Jul. 2, 2004 (TW) .............................. 93119966 A

(51) Int. Cl.
*G11C 11/24* (2006.01)
(52) U.S. Cl. .................. 365/149; 365/149; 365/189.09
(58) Field of Classification Search ................ 365/149, 365/190, 189.09
See application file for complete search history.

(56) References Cited

U.S. PATENT DOCUMENTS

| 5,724,286 | A | * | 3/1998 | Gillingham | ............ 365/189.11 |
| 5,903,511 | A | * | 5/1999 | Gillingham | ............ 365/230.06 |
| 6,118,717 | A | * | 9/2000 | Brady | ........................ 365/207 |
| 6,421,285 | B1 | * | 7/2002 | Matsuzaki et al. | .......... 365/200 |
| 6,741,514 | B1 | * | 5/2004 | Sako | ........................... 365/205 |
| 6,829,682 | B1 | * | 12/2004 | Kirihata et al. | ............. 711/143 |

* cited by examiner

*Primary Examiner*—Thong Q. Le
(74) *Attorney, Agent, or Firm*—Akin Gump Strauss Hauer & Feld, LLP

(57) ABSTRACT

A method of operating a dynamic random access memory (DRAM) using a bit line and a bit line bar is disclosed. The DRAM stores data by using a charge storage device, which is coupled to the bit line via a switch device. A voltage drop occurs when the switch device is turned on. The method programs the charge storage device with a first voltage or a zero voltage in response to a power voltage reduction due to the voltage drop. For accessing the data, the bit line and the bit line bar are charged to the power voltage, the switch device is turned on and the data stored in the charge storage device is determined according to a voltage difference between the bit line and the bit line bar.

17 Claims, 5 Drawing Sheets

METHOD OF OPERATING DYNAMIC RANDOM ACCESS MEMORY

CROSS-REFERENCE TO RELATED APPLICATION

This application claims the priority benefit of Taiwan application serial no. 93119966, filed Jul. 2, 2004.

BACKGROUND OF THE INVENTION

1. Field of the Invention

The present invention relates to a method of operating a dynamic random access memory (DRAM), and more particularly to a method of operating a DRAM without using a charge pump.

2. Description of Related Art

Dynamic random access memory (DRAM) has been widely used in a variety of electronic products, such as computers, memory cards or related products. FIG. 1 is a schematic drawing showing a prior art memory cell array of DRAM. In the prior art design, a memory cell comprises a switch device 100 and a charge storage device 110. The charge storage device 110 is coupled to the bit line BL or the bit line bar BLB via the switch device 100. The switch device 100 is either a P-type or an N-type metal oxide semiconductor (MOS) device and can be controlled via the voltage of the word lines WL0–WL3.

In the conventional operating method of DRAM, the voltage at the point (called memory point thereafter) 120 represents the data stored in the memory cell where the charge storage device 110 is coupled to the switch device 100 at the memory point 120. Generally, when the data is logic 0, the voltage of the memory point 120 is pulled down to zero voltage. When the data is logic 1, the voltage of the memory point 120 is pulled up to the power voltage VDD. During the reading operation, the bit line BL and the bit line bar BLB are charged to the same voltage, e.g. one half of the power voltage VDD. In order to turn on the switch device 100, the word line WL0 is charged to the voltage VPP, which is about VDD+VTN+0.3V, wherein VTN represents the threshold voltage of the switch device 100. After the switch device 100 is turned on, the voltage of the bit line BL is changed because voltage is being shared with the charge storage device 110 hence the sensor of DRAM senses the voltages of the bit line BL and the bit line bar BLB. The data stored in the memory cell can then be identified by the voltage differences.

FIG. 2 is a circuit block diagram showing a prior art driving circuit of DRAM. The operation of the DRAM 20 is similar to that described above. However, there is a disadvantage in the prior art DRAM. In order to provide the voltage VPP, which is higher than the normal power voltage, a charge pump 200 is applied in the driving circuit of the DRAM shown in FIG. 2. Since the bit line BL and the bit line bar BLB have to be charged to one half of the power voltage VDD, DRAM 20 has to supply direct voltage of VDD/2. Because of the charge pump 200 and the additional direct voltage, the DRAM 20 consumes powers even when it is in stand-by mode. The power consumption shortens the service life of cells of portable devices.

SUMMARY OF THE INVENTION

Accordingly, the present invention is directed to a method of operating dynamic random access memory (DRAM). The method is capable of operating DRAM without using a charge pump and a VDD/2 voltage.

The present invention is directed to a writing operation of DRAM. The writing operation writes data in the DRAM without using a charge pump.

The present invention is directed to a reading operation of DRAM. The reading operation reads data stored in the DRAM without using a charge pump.

According to an embodiment of the present invention, the method is adapted to the DRAM using a bit line and a bit line bar, and a charge storage device is adapted for storing data. The charge storage device is coupled to the bit line via a switch device. When the switch device is turned on, a switch voltage drop is generated between the two ends of the switch. The charge storage device is programmed with a first voltage, which is VDD minuses the switch voltage, or a zero voltage. The method can also access the data. For accessing the data, the bit line and kit line bar are charged to the power voltage. Next, the switch device is turned on and then the data stored in the charge storage device is determined according to a voltage difference between bit line and bit line bar.

According to another embodiment of the present invention, a voltage of the bit line bar is pulled down a preset voltage before determining the data stored in the charge storage device. The preset voltage is one half of the voltage drop on the bit line while the switch device is being turned on after the charge storage device is being programmed by a zero voltage.

Accordingly, the DRAM can be operated with the power voltage without using a charge pump.

The above and other features of the present invention will be better understood from the following detailed description of the preferred embodiments of the invention that is provided in communication with the accompanying drawings.

DESCRIPTION OF EMBODIMENTS

Figure 1:
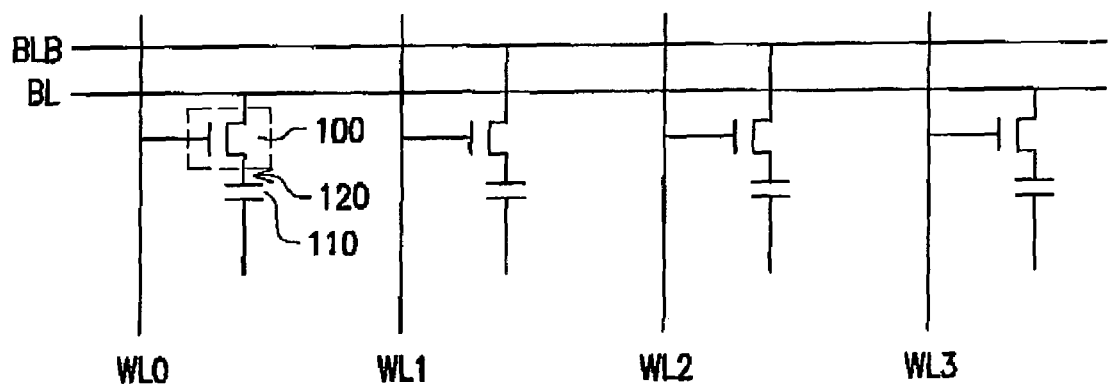
FIG. 1 is a schematic drawing showing a prior art memory cell array of DRAM.
Figure 2:
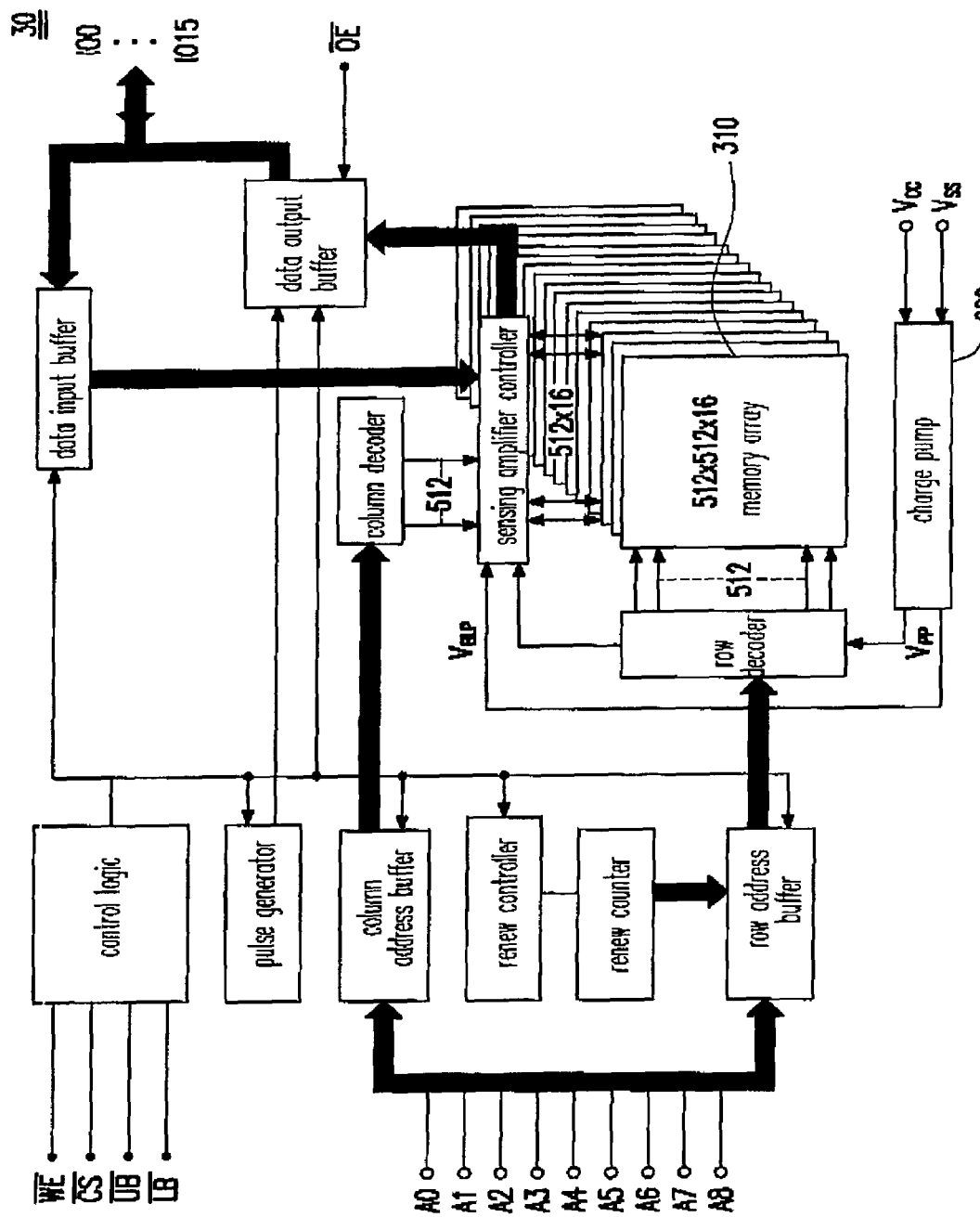
FIG. 2 is a circuit block diagram showing a prior art driving circuit of DRAM.
Figure 3:
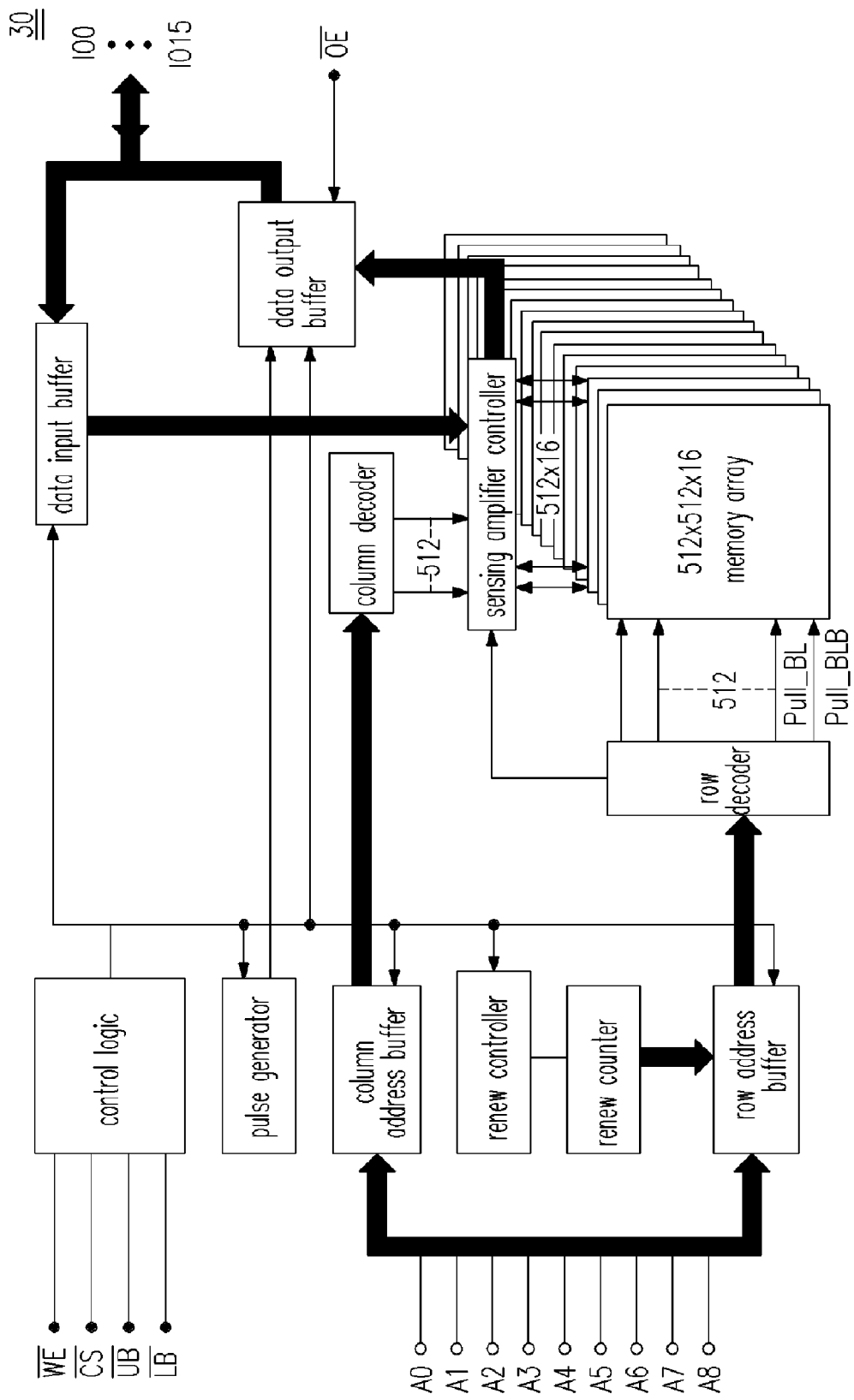
FIG. 3 is a circuit block diagram showing a circuit layout of a dynamic random access memory (DRAM) according to an embodiment of the present invention.

FIG. 3 is a circuit block diagram showing a circuit layout of a dynamic random access memory (DRAM) according to an embodiment of the present invention. The design of memory cells is shown in FIG. 1. In this embodiment, most of the devices are similar to those shown in FIG. 2 except that the DRAM 30 of this embodiment does not require the charge pump 200. In this embodiment, the memory array 310 uses the VDD applied from a power terminal (not shown) as the maximum voltage. Generally, the voltage applied for storing logic 1 data can be slightly lower than the power voltage VDD; and the voltage applied for storing logic 0 data can be a zero voltage and vice versa. The maximum voltage applied to the bit line BL and the bit line bar BLB is the power voltage VDD as shown in FIG. 1.

Figure 4:
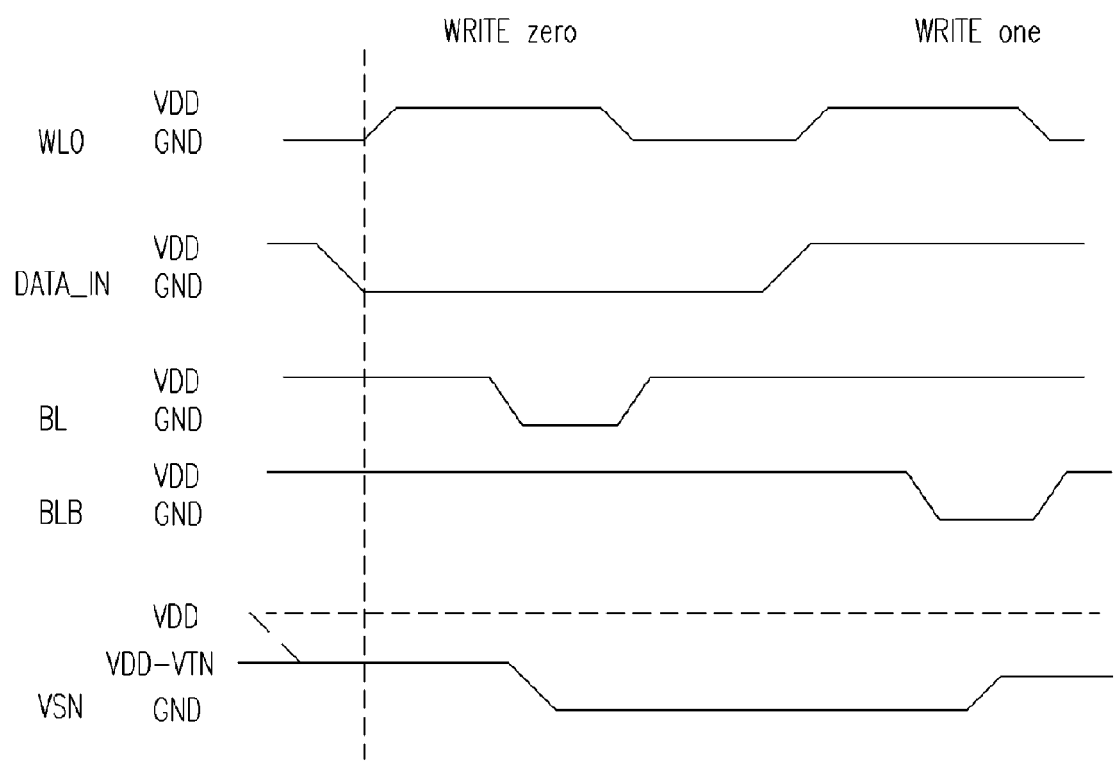
FIG. 4 is a control line/data line time sequence of a writing operation of a DRAM according to an embodiment of the present invention.

The present invention is also directed to a method of operating the DRAM without using a charge pump. The method could be employed on the DRAM shown in FIG. 2 or FIG. 3. FIG. 4 is a control line/data line time sequence of a writing operation of a DRAM according to an embodiment of the present invention.

Following are the descriptions of writing logic 0 data in memory cells. For writing data in memory cells, the voltage of the word line WL0 is pulled up to the power voltage VDD provided by the power terminal for turning on the switch devices of the memory cells. The data input signal DATA_IN is written as logic 0. After the voltage of the word line WL0 is pulled up to the power voltage VDD, data is transmitted to the bit line BL. By turning on the switch device, the data is written into the memory cell. After the logic 0 is written into the memory cell, the storage voltage VSN of the memory cell becomes zero.

The method of writing logic 1 is similar to that of writing logic 0 except that the storage voltage of the memory cell is VDD negative VTN, wherein VTN represents the voltage drop in the switch device (hereinafter, switch voltage drop). One of ordinary skill in the art will understand that the zero voltage may represent logic 1, and the voltage VDD−VTN may represent logic 0 depending on the design of the circuit.

Figure 5:
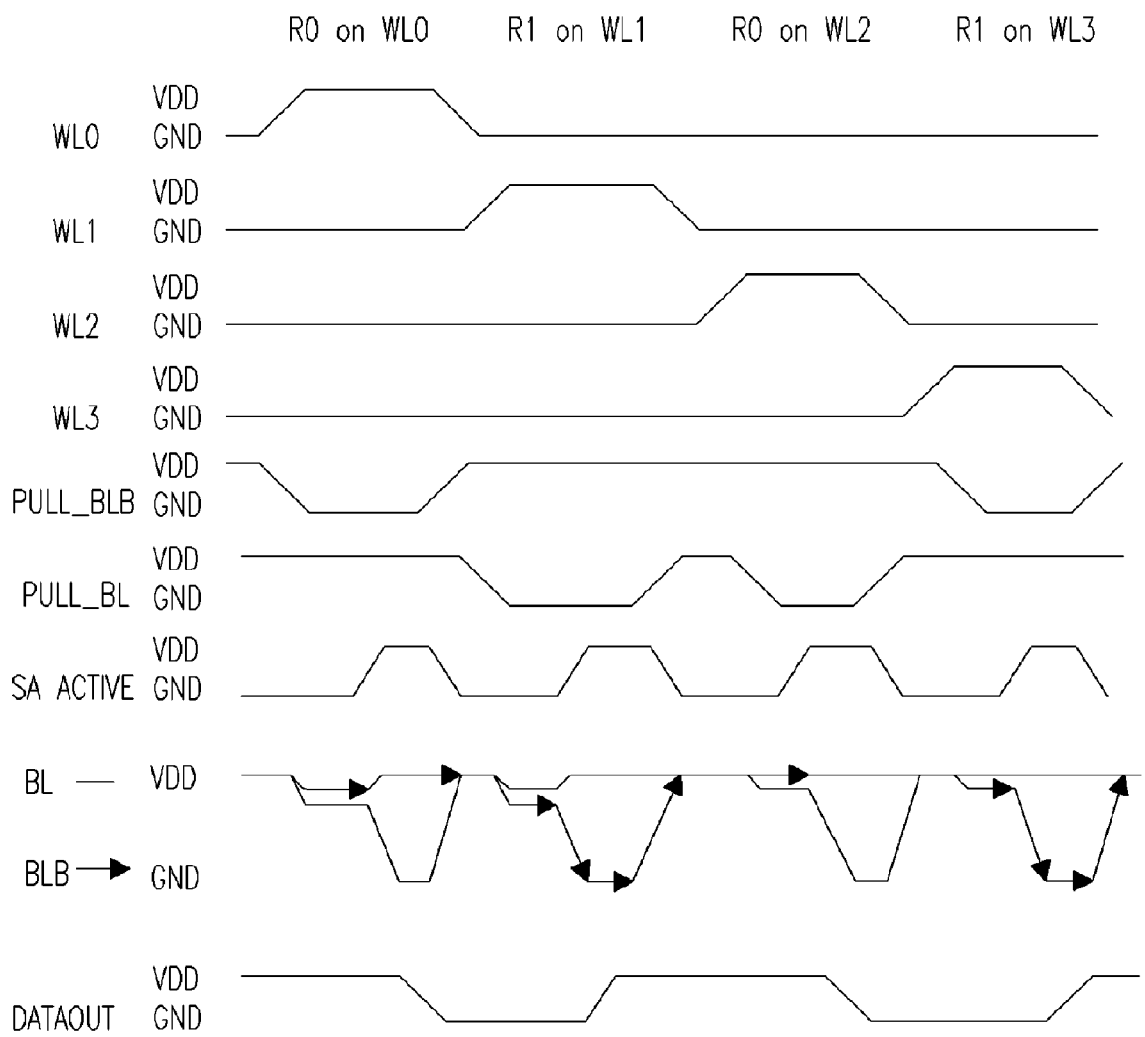
FIG. 5 is a control line/data line time sequence of a reading operation of a DRAM according to an embodiment of the present invention.

The present invention is also directed to a reading operation of DRAM. FIG. 5 is a control line/data line time sequence of a reading operation of a DRAM according to an embodiment of the present invention. In this embodiment, according to the arrangement of the word lines WL0–WL3, the data stored in the memory cells are 0, 1, 0 and 1. In this embodiment, the sequence of the reading operation follows WL0, WL1, WL2 and WL3. The word lines WL0–WL3 and the bit line BL and the bit line bar BLB are coupled as shown in FIG. 1. Signals PULL_BL and PULL_BLB control pulling down the voltage of the bit line BL and the bit line bar BLB. In this operation, logic low is the active standard.

In this embodiment, the bit line BL and the bit line bar BLB are charged to the power voltage VDD. The word line WL0 is then charged to the power voltage VDD. Due to the charging of the word line WL0, the switch device of the memory cell is turned on. When the switch device is turned on, the logic 0 data stored in the memory cell is coupled to the bit line BL, and the power voltage VDD of the bit line BL is pulled down. The pull-down voltage of the bit line BL caused by the logic 0 data is called a logic 0 read pull-down voltage. After the word line WL0 turns on the switch device, the voltage of the bit line bar BLB is pulled down before the sensor is activated, i.e. the pull-up to logic high of SA ACTIVE. The pull-down voltage is preferably one half of the logic 0 read pull-down voltage. Accordingly, while the switch device is being activated, the sensor can easily sense the voltage difference between the bit line BL and the bit line bar BLB so as to sense that the data stored in the memory cell is logic 0. After the sensing step is completed, the voltage of the bit line is pulled down to logic 0 so as to rewrite data into the memory cell.

One of ordinary skill in the art will understand that the pull-down voltage of the bit line bar BLB is modifiable. As long as the differential voltage between the bit line BL and the bit line bar BLB can be sensed, the operation of the DRAM can be performed. The present invention, therefore, is not limited to this embodiment.

The step of reading the logic 1 data stored in the memory cell coupled to the word line WL1 is similar to that of reading the logic 0 data except that the memory cell controlled by the word line WL1 is coupled to the bit line bar BLB. The logic 1 data is represented by a zero voltage. The operations of the bit line BL and the bit line bar BLB in this embodiment are reverse to those of reading the data stored in the memory cell coupled to the word line WL0. The operations of the control lines PULL_BL and PULL_BLB are also reverse to those of reading the data stored in the memory cell coupled to the word line WL0.

Following are the descriptions of operations of the control line/data line for reading the logic 0 data. Referring to FIG. 5, the data stored in the memory cell controlled by the word line WL2 is logic 0. After the bit line BL and the bit line bar BLB are charged to the power voltage VDD, the word line WL2 turns on the switch. As the memory cell is coupled to the bit line bar BLB, the voltage of the logic 0 is preferably VDD−VTN. The memory cell stores the logic 0 data. The turning-on of the memory therefore does not affect the voltage of the bit line bar BLB. After the reading process, the bit line bar BLB is maintained at higher voltage for rewriting the data into the memory cell. With the condition similar to that described above, when reading the data stored in the memory cell controlled by the word line WL3, the operations of the control line/data line are similar to those of reading the data stored in the memory cell coupled to the word line WL2 except that the voltages are applied to the bit line BL, the bit line bar BLB and the control lines PULL_BL and PULL_BLB.

According to an embodiment of the present invention, the maximum voltage is the power voltage VDD provided by the power terminal without using the charge pump. The bit line BL and the bit line bar BLB need not be maintained at the voltages, such as the transient voltage resulting from sharing the voltage with the memory cell or the transient pull-down voltage, except for the power voltage VDD and the ground voltage GND. During stand-by mode, no additional direct current is required to maintain the voltages of the bit line BL and the bit line bar BLB. Therefore, the operating method of the DRAM of the present invention consume less power.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention.

What is claimed is:

1. A method of operating a dynamic random access memory (DRAM) using a bit line and a bit line bar, wherein a charge storage device of the DRAM is adapted for storing data, and is coupled to the bit line via a switch device, the method comprising:

programming the charge storage device with a data status of a first status or a second status; and accessing the data stored in the charge storage device, accessing the data comprising:

providing the bit line and the bit line bar with an initial bias, wherein the bit line has a first-status bias when the bit line is coupled to the charge storage device in the first status and the bit line has a second-status bias when the bit line is coupled to the charge storage device in the second status;

providing the bit line bar with a sensing bias approximately when the bit line is coupled to the charge storage device, wherein the sensing bias is different from the initial bias of the bit line and is between the first-status bias and the second-status bias;

coupling the bit line with the charge device to obtain a read-out level at the bit line; and identifying the data status of the charge storage device by comparing the read-out level with the sensing bias.

2. The operating method of claim 1, wherein the sensing bias is equal to or approximates a level of the first status bias minus one-half of the voltage difference between the first status bias and the second status bias.

3. The operating method of claim 1, wherein coupling the bit line with the charge device to obtain the read-out level at the bit line comprises turning on a switch device controlled by a word line, the switch being coupled with the storage device.

4. The operating method of claim 1, wherein the first status equals to or approximates a ground-level voltage.

5. The operating method of claim 1, wherein the second status approximates or is slightly lower than a power-level voltage.

6. The operating method of claim 1, wherein the initial bias equals to or approximates a power-level voltage.

7. The operating method of claim 1, wherein the dynamic random access memory (DRAM) is operated without using a charge pump.

8. The operating method of claim 1, wherein the first-status bias approximates the initial bias minus a voltage drop from the initial bias to the first-status bias caused by the charge storage device in a logic 0 state.

9. The operating method of claim 1, wherein the first-status bias approximates the initial bias minus a voltage drop from the initial bias to the first-status bias caused by the charge storage device in a logic 1 state.

10. A method of accessing a dynamic random access memory (DRAM) having a bit line and a bit line bar, wherein a charge storage device of the DRAM is adapted for storing a data status of one of a first status or a second status, the method comprising:

providing the bit line and bit line bar with an initial bias, wherein the bit line has a first-status bias when the bit line is coupled to the charge storage device in the first status and the bit line has a second-status bias when the bit line is coupled to the charge storage device in the second status;

providing the bit line bar with a sensing bias approximately when the bit line is coupled to the charge storage device, wherein the sensing bias is between the first-status bias and the second-status bias;

coupling the bit line with the charge device to obtain a read-out level at the bit line;

identifying the data status of the charge storage device by comparing the read-out level with the sensing bias.

11. The accessing method of claim 10, wherein coupling the bit line with the charge device to obtain the read-out level at the bit line comprises turning on a switch device controlled by a word line, the switch being coupled with the storage device.

12. The accessing method of claim 10, wherein first status equals to or approximates a ground-level voltage.

13. The accessing method of claim 10, wherein the second status approximates or is slightly lower than a power-level voltage.

14. The accessing method of claim 10, wherein the initial bias equals to or approximates a power-level voltage.

15. The accessing method of claim 10, wherein the sensing bias is different from the initial bias and the sensing bias equals to or approximates a level of the first status bias minus about one-half of the voltage difference between the first status bias and the second status bias.

16. The operating method of claim 10, wherein the first-status bias approximates the initial bias minus a voltage drop from the initial bias to the first-status bias caused by the charge storage device in a logic 0 state.

17. The operating method of claim 10, wherein the first-status bias approximates the initial bias minus a voltage drop from the initial bias to the first-status bias caused by the charge storage device in a logic 1 state.

* * * * *